(12) United States Patent (10) Patent No.: US 7,796,465 B2
Swain et al. (45) Date of Patent: Sep. 14, 2010

(54) WRITE LEVELING OF MEMORY UNITS DESIGNED TO RECEIVE ACCESS REQUESTS IN A SEQUENTIAL CHAINED TOPOLOGY

(75) Inventors: Jyotirmaya Swain, Bangalore (IN); Edward L Riegelsberger, Fremont, CA (US); Utpal Barman, Bangalore (IN)

(73) Assignee: NVIDIA Corporation, Santa Clara, CA (US)

( * ) Notice: Subject to any disclaimer, the term of this patent is extended or adjusted under 35 U.S.C. 154(b) by 111 days.

(21) Appl. No.: 12/169,662

(22) Filed: Jul. 9, 2008

(65) Prior Publication Data

US 2010/0008176 A1 Jan. 14, 2010

(51) Int. Cl.
*G11C 8/16* (2006.01)
*G11C 8/18* (2006.01)
*G11C 7/00* (2006.01)

(52) U.S. Cl. .................. 365/233.13; 365/193; 365/194; 365/233.12

(58) Field of Classification Search ............. 365/233.13
See application file for complete search history.

(56) References Cited

U.S. PATENT DOCUMENTS

| | | | |
|---|---|---|---|
| 5,023,776 A | 6/1991 | Gregor | |
| 5,640,366 A | 6/1997 | Majos et al. | |
| 5,809,514 A | 9/1998 | Nasserbakht et al. | |
| 6,006,339 A * | 12/1999 | McClure | 713/500 |
| 6,167,528 A | 12/2000 | Arcoleo | |
| 6,370,067 B1 | 4/2002 | Ko et al. | |
| 6,480,946 B1 | 11/2002 | Tomishima et al. | |
| 6,516,362 B1 * | 2/2003 | Magro et al. | 710/58 |
| 6,603,694 B1 | 8/2003 | Frankowsky et al. | |
| 6,615,345 B1 | 9/2003 | LaBerge | |
| 6,665,231 B2 * | 12/2003 | Mizuno et al. | 365/233.12 |
| 6,738,918 B2 | 5/2004 | Toda | |
| 7,343,533 B2 | 3/2008 | Lee et al. | |
| 7,385,861 B1 | 6/2008 | Zhu | |
| 7,392,465 B2 | 6/2008 | Azimane et al. | |
| 2002/0040454 A1 | 4/2002 | Raad et al. | |
| 2002/0184461 A1 | 12/2002 | Zumkehr | |
| 2004/0104749 A1 * | 6/2004 | Yeh | 327/141 |
| 2005/0135167 A1 * | 6/2005 | Manabe | 365/201 |
| 2005/0182993 A1 | 8/2005 | Okawa et al. | |
| 2006/0041799 A1 | 2/2006 | Sato | |
| 2006/0256205 A1 | 11/2006 | Kim et al. | |
| 2007/0008791 A1 | 1/2007 | Butt et al. | |
| 2008/0238516 A1 | 10/2008 | Iorga | |

OTHER PUBLICATIONS

"JEDEC Standard", "DDR3 SDRAM Specification", Date: Sep. 2007, pp. 1-189.

* cited by examiner

*Primary Examiner*—Son L Mai (57) ABSTRACT

A memory controller provided according to an aspect of the present invention uses a slower clock signal during write leveling compared to when performing write operations thereafter. Due to such use of a slower clock signal, the various desired delays can be determined accurately and/or easily. In an embodiment, the frequency of the slower clock signal is determined based on the maximum fly-by delay (generally the delay between sending of a signal on the shared sequential path and the receipt at the memory unit in the sequence) that may be present in the memory system. For example, if the fly by delay can be M (an integer) times the time period of the clock signal during normal write operations, the slower clock signal may have a time period of M times that of the clock signal during write operation.

20 Claims, 5 Drawing Sheets

WRITE LEVELING OF MEMORY UNITS DESIGNED TO RECEIVE ACCESS REQUESTS IN A SEQUENTIAL CHAINED TOPOLOGY

BACKGROUND

1. Field of Disclosure

The present invention relates to the design of memory systems and more specifically to write leveling of the memory units employed in such memory systems.

2. Related Art

There are several memory systems in which memory units are designed to receive access requests in a sequential chained topology. In such systems, a memory controller typically sends control and address information on a single path, which passes the information to each of the memory units sequentially in the same order as in which the memory units are chained. DDR3 technology based memory systems are examples of such memory systems, with DRAMs being used as memory units, as is well known in the relevant arts.

Write leveling is often performed prior to performing write operations in such memory systems. Write leveling generally entails determining delays with which different signals need to be asserted during write operations, given the various delays that could occur in the sequential chained topology.

For example, in the case of DDR3 based technologies, it may be desirable to assert a strobe signal synchronous with (at the same time instance) a rising edge of the clock signal received from the memory controller on the single path. However, at least due to the fly-by delay in the single path, different memory units may receive the rising edge with different delays. It may therefore be necessary to determine the specific corresponding delay with which the strobe signal is to be asserted for each of the memory units Once such delays are determined, the various signals can be asserted with appropriate timing for a desired level of throughput performance and accuracy during write operations.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A memory controller provided according to an aspect of the present invention uses a slower clock signal during write leveling compared to when performing write operations thereafter. Due to such use of a slower clock signal, the various desired delays can be determined accurately and/or easily.

In an embodiment, the frequency of the slower clock signal is determined based on the maximum fly-by delay (generally the delay between sending of a signal on the shared sequential path and the receipt at the last memory unit in the sequence) that may be present in the memory system. For example, if the fly by delay can be up to M times (M being an integer) the time period of the clock signal during normal write operations, the slower clock signal may have a time period of M times that of the clock signal during write operation.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Memory System

Figure 1:
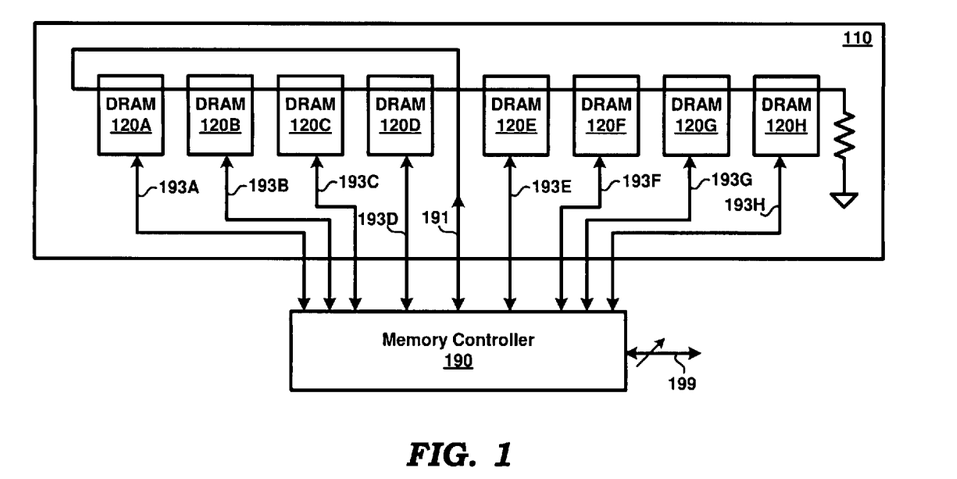
FIG. 1 is a block diagram of an example memory system in which several aspects of the present invention can be implemented.

FIG. 1 is a block diagram illustrating the details of an example memory system in which several aspects of the present invention can be implemented. For illustration, it is assumed that the memory system is based on DDR3 technology described in further detail in a document entitled, "DDR3 SDRAM Specification, Revision: JESD79-3A", dated September 2007 from JEDEC SOLID STATE TECHNOLOGY ASSOCIATION. However, the features can be implemented in other types of memory systems employing sequential chained topology to receive access requests.

The memory system is shown containing memory controller 190 and dual-in-line memory module (DIMM) 110. DIMM 110 in turn is shown containing memory units (DRAMs) 120A-120H. Each block is described below in further detail.

Memory controller 190 sends control and address signals/information on chain path 191. The control signals may include a clock signal, operation type (example read request, write request or mode instructions to start various types of calibration, etc.). The address specifies the specific (same) address in each of the memory units from which the data portion is to be accessed. The location of each DRAM along chain path 191 defines a sequential order, with DRAM 120A in the first position and DRAM 120H in the last position. Each DRAM receives the control/address information in the same order (with corresponding delay) as the sequential order defined by the connections to chain path 191.

Each memory unit 120A-120H performs the specific operation specified by the operation type in response to receiving the control signals on chain path 191. The data portion DQ (for example, 8 bit byte in case of an embodiment of a DRAM) along with DQS (DQ strobe) signal is present on each of paths 193A-193H for DRAMs 120A-120H respectively for read/write operations. In case of write operation, the data DQ is provided and DQS asserted by memory controller 190.

In case of write operation, in an embodiment in accordance with DDR3 technology, memory controller 190 may provide DQ and DQS to the corresponding memory unit to write a single byte. A byte each may be written to each of the memory units during a single edge and eight bytes may be written to each of the eight DRAMs. Thus, 64 bytes may be written in a burst mode in four clock cycles, with the DQ and DQS for each memory unit being provided corresponding eight times. The 64 bytes (8 bytes to each of the memory units) thus written are referred to as a cache line.

Prior to the write operation, a write leveling may need to be performed to determine the various delays based on which the DQ and DQS signals can be asserted, for example, in relation to the time at which the control/clock signals are sent on path 191. In case of DDR3 technology, it is generally desirable that the DQS signal (for a memory unit) be asserted synchronous with the rising edge of the clock signal received by the corresponding memory unit on path 191. Due to the (fly by) propagation delay of the clock signal along path 191 (and other requirement), the DQS signal may accordingly need to be delayed after the rising edges leave memory controller 190. The determination of such delay may be termed as write leveling.

An aspect of the present invention enables such write leveling to be performed accurately even when the fly-by delay exceeds the time period of the clock signal used during the regular access operations.

The features of the present invention will be clearer in comparison with a prior approach that does not use one or more features of the present invention, and accordingly the description is provided first with respect to the prior approach.

3. Timing Diagram in a Prior Approach

FIGS. 2A-2D are timing diagrams illustrating the timing relationship of various signals in a write leveling operation of a prior approach. For ease of understanding, four diagrams are shown as being performed in parallel with a common clock reference, though the operation would be sequential (i.e., the operation with respect to FIG. 2B following that in FIG. 2A, etc.) with reference to the same clock.

CK1 represents the clock signal as it is generated and sent from memory controller 190. CK2 represents the clock signal as it is received at DRAM 120H (one of the memory units). It is first assumed that the fly-by delay is substantially less than one clock cycle of the clock signal and thus the delay in reception at the memory unit is assumed to be the time duration 201 to 202.

In an approach, write leveling is performed by determining (in memory controller 190) the delay with which one of the edges (say rising edge) is found on CK2 once sent at CK1. Thus assuming edge 211 of CK1 is of interest, it would be necessary to determine the specific time instance/point at which edge 212 would occur on CK2. The corresponding delay represents the delay with which DQS signal may need to be asserted relative to an edge (of CK1, assuming it is used for later write operation) to ensure that the DQS signal is received synchronous with the corresponding edge (of CK2) in the memory unit.

Broadly, memory controller 190 first sends a mode instruction on shared path 191 to place each of the memory units in DIMM 110 in write leveling mode. In the write leveling mode, each memory unit is designed to sample CK2 when the rising edge of DQS is received, and the sampled value is sent back on DQ bus for the corresponding memory unit.

Memory controller 190 may search for the successive incremental delays at which the edge transition occurs. That is, when the delay is changed by a small incremental value, the received DQ value should reflect the transition.

Figure 2A:
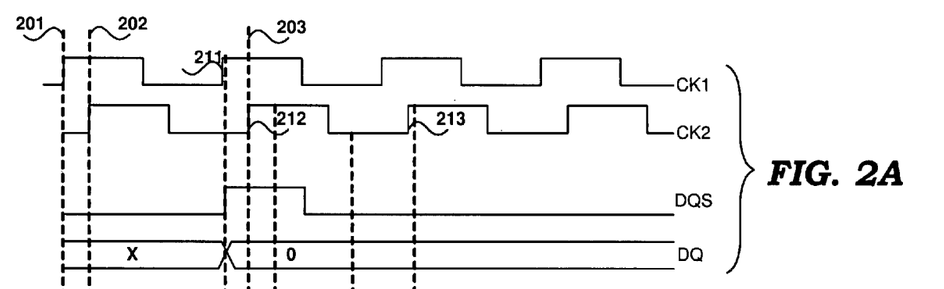
FIG. 2 is a timing diagram illustrating some problems encountered with write leveling in an example prior approach.
Figure 2B:
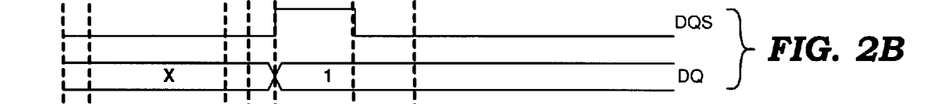
Figure 2C:
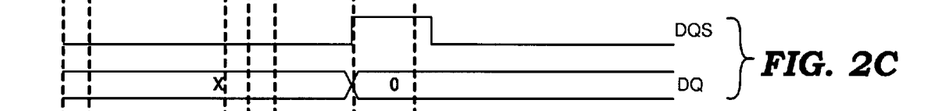
Figure 2D:
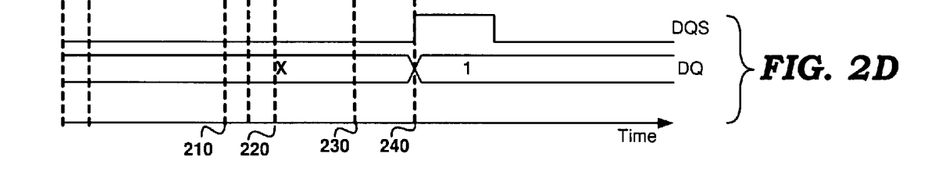

Thus, the DQ value of FIG. 2A shows a sampled value of 0 (before edge 212 on CK2) when DQS is asserted at time instance 210, while that in FIG. 2B shows a sampled value of 1 (after edge 212 on CK2) when DQS is asserted at time instance 220.

The desired transition may thus be determined to be within a range of delays corresponding to FIGS. 2A and 2B. Several samples may be taken within that duration to determine the delay (201-202) with a desired degree of accuracy. In an embodiment, time instance 210 corresponds to an instance immediately after the rising edge 211 and the delay is incremented gradually until a transition is detected.

The approach of above may be error prone if the fly by delay can be more than the clock period of the clock cycle. The potential error is thus illustrated assuming that the clock signals is delivered with a delay equaling the duration 201-203 (more than one clock period/cycle of CK1).

In such a scenario, the correct edge to determine would be edge 213 (corresponding to edge 211 of CK1 delayed by the applicable fly by delay of more than one clock period). Thus, memory controller 190 needs to sample at time instances 230 and 240 (before and after the edge 213) and conduct any required searches within that duration to accurately determine the delay (write leveling) sought to be determined.

However, memory controller 190 may erroneously determine that the delay is duration between the rising edges 211 and 212 by finding edge 212. Such a situation is particular concern as the speeds of the memory units increase substantially since the clock period would shrink correspondingly.

An aspect of the present invention allows at least such errors to be avoided as described below in further detail.

4. Reliable Write Leveling

Figure 3:
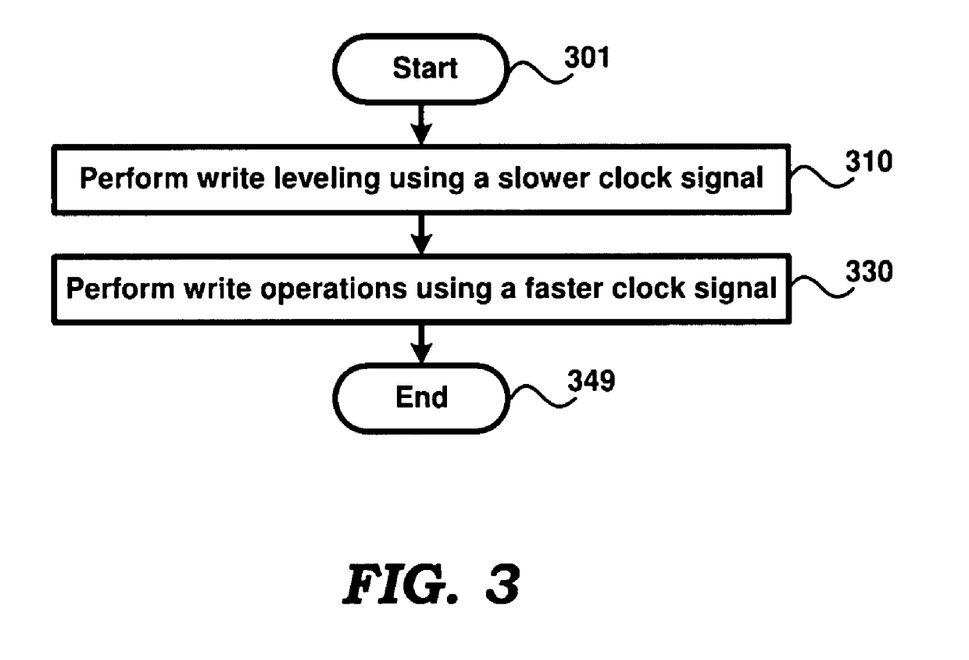
FIG. 3 is a flow chart illustrating the manner in which write leveling is performed in an embodiment of the present invention.

FIG. 3 is a flowchart illustrating the manner in which each of the DRAMs may be calibrated reliably for write leveling according to an aspect of the present invention. The flowchart is described with respect to FIG. 1 (and in reference to DRAM 120A) merely for illustration. However, various features can be implemented in other environments (and other DRAMs) also without departing from the scope and spirit of various aspects of the present invention, as will be apparent to one skilled in the relevant arts by reading the disclosure provided herein. Many of such implementations are contemplated to be covered by several aspects of the present invention. The flow chart begins in step 301, in which control immediately passes to step 310.

In step 310, memory controller 190 performs write leveling using a slower clock signal (with correspondingly lower frequency or higher period) to determine various delays of interest. The delays thus determined are used to thereafter perform write operations in step 330, but using a faster clock signal.

In general, the frequency of the faster clock signal is determined by the performance requirements during normal operation of the memory system. By using a slower clock signal with a clock period of more than the maximum expected delay, at least the problems noted with respect to FIGS. 2A-2D above, may be avoided. In embodiments described below, the slower clock signal is conveniently chosen as a divided clock signal (of the clock signal used for access operations), satisfying this requirement.

The performance of write operations based on the determined delay, will be apparent to one skilled in the relevant arts by reading the disclosure provided herein. For example, in the case of DDR technology noted above, the calibrated delay can be used by memory controller 190 (in later write operations) to ensure that DQS is asserted to be synchronously received with the rising edge of the clock signal (on path 191)

by each memory unit (or within permissible range in relation to the rising edge). The flowchart ends in step 349.

The features described above can be employed in various embodiments of the memory controller. The description is continued with respect to the details of an example memory controller.

5. Memory Controller

Figure 4:
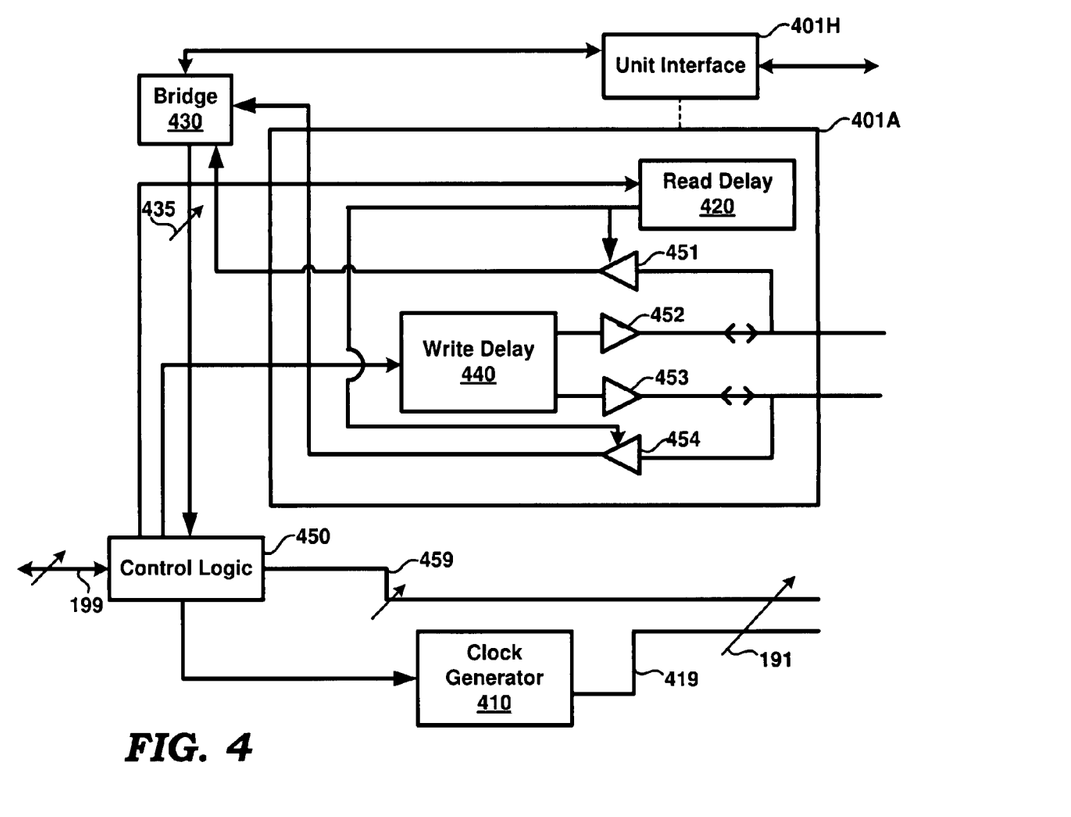
FIG. 4 is a block diagram illustrating the details of a memory controller in an embodiment of the present invention.

FIG. 4 is a block diagram illustrating the details of a memory controller in an embodiment of the present invention. Only the details as relevant to the access operation are shown for conciseness. Memory controller 190 is shown containing clock generator 410, unit interfaces 401A-401H, and control logic 450. Unit interface 401A is in turn shown containing read delay 420, bridge 430, write delay 440, and buffers 451-454. For conciseness, only the details of one unit interface is shown, though the remaining unit interfaces (for the other memory units) can be implemented similarly. Each of the blocks is described below in further detail.

Control logic 450 performs the operations described with respect to FIG. 3 above and determines the various delay values as relevant to write leveling. The delay parameters determined with respect to write leveling may be stored in write delay 440. Similarly, read leveling may also performed and the determined parameters may be stored in read delay 420. The determination and storing may be performed once the memory controller is turned on (powered on), and potentially be used until the memory controller is turned off again.

In addition, control logic 450 receives read and write commands on path 199, and issues corresponding requests on path 191. The write commands may specify the specific addresses in which to write the bytes of each cache line, and the corresponding start address may be sent as a part of the write request on path 191. The appropriate byte value is provided on DQ path while asserting the DQS signal at the right time instance (to attempt to synchronize the DQS assertion with the rising edge of the clock signal received by the corresponding memory unit).

Using the delay values determined by write leveling, the respective delays with which DQ/DQS can be sent/provided, can be determined in a known way. Upon completion of a write operation (of all the bytes of the cache line, i.e., eight successive bytes written to each memory unit in burst mode), an acknowledgement may be sent on path 199.

Path 199 may be connected to a processor (e.g., a central processing unit, not shown), which issues the read and write commands based on execution of various software instructions. The software instructions may implement user applications (e.g., data processing, graphics processing, etc.).

Figure 5A:
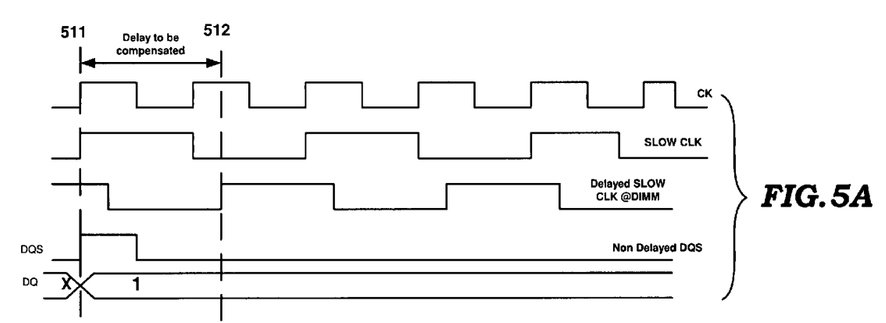
FIGS. 5A and 5B are timing diagrams illustrating the operation of a memory controller in an embodiment of the present invention.
Figure 5B:
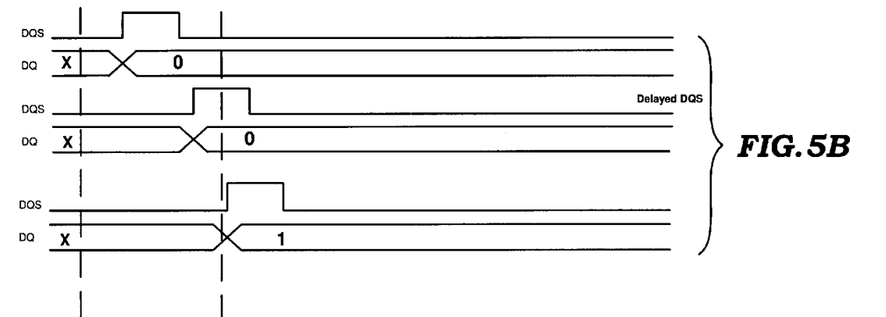

Clock generator 410 provides clock signal 419 for operation of each of the DRAMs 120A-120H. The same signal is received with respective time skew at the respective DRAMs. Clock generator 410 may provide other clock signals (some divided) for the operation of other internal components of memory controller. As described below with respect to FIG. 5, a divided clock signal is sent on path 419/191 during write leveling (in time durations specified by control logic 450), while a faster clock signal is sent on the same path during normal write operations. These signals may be alternatively viewed as the same clock signal with different frequencies/periods.

Write delay 440 delays the writing of data and assertion of the DQS signal by a magnitude specified by the control logic. The data (byte) to be written is received from control logic 450. Buffers 452 and 453 respectively are used to provide the write DQS and the data DQ respectively. Each of these buffers is tri-stated when the write operation is not being performed, to isolate the signals on the shared bus. Read delay 420 controls the durations in which input buffers 451/554 can receive and pass the DQ/DQS signals.

Due to the accurate write leveling operation, the write operations may be performed accurately as well. The operation of the circuit of above in an example environment is illustrated below with respect to a timing diagram.

6. Timing Diagram Using Slower Clock Signal

FIGS. 5A and 5B are timing diagrams illustrating the timing relationship of various signals in a write leveling operation in an embodiment of the present invention. For ease of understanding, the two diagrams are shown as being performed in parallel with a common clock reference, though the operation would be sequential with reference to the same clock.

CK represents the clock signal used within memory controller 190 during write leveling (i.e., after appropriate instruction is sent to place the memory units in write leveling mode) as well as the clock signal used during normal write operations. The slower clock signal (Slow CLK) is assumed to have half the frequency of CK assuming that the maximum possible delay to be measured is more than one clock cycle of CK and less than two cycles of CK. The delayed slow CLK represents the slow clock signal when received at the memory unit, on which write leveling is sought to be performed.

In the illustrative example here, the delay sought to be measured is assumed to be duration between edges 511 and 512, which is more than one cycle of CK. The duration between edges 511 and 512 is a measure of when the clock/control signals would be available in the respective memory unit after being sent from memory controller 190.

In FIG. 5A, it is shown that the DQS is initially positive-edge aligned to the controller (non delayed) slow CLK. Then memory controller 190 iteratively incrementally adds delay on DQS signal (3 such iterations shown) such that the positive edge of the slow delayed clock (at the memory unit of interest) is detected based on change of value from 0 to 1 on DQ (as shown in FIG. 5B). A bigger increment value may be alternatively used until a transition is detected and then search conducted with finer granularity of delay increments within the range defined by the delay values before and after the transition.

It may be readily observed that no additional rising transitions are present on the delayed slow clock for 2 clock cycles of CK, thereby avoiding the false detection described above with respect to FIG. 2.

Thus, using several features described above, write leveling may be performed accurately. As a result, the write operations may thereafter be performed accurately. In general, the timing of the DQS/DQ signals is controlled according to the write leveling delay. The signals are generally delayed more for a correspondingly higher determined values of the write leveling delay.

It should be further appreciated that the same memory controller provided by one vendor may need to operate in different environments with a range of fly by delays (some having a fraction of the clock period and some potentially more than one clock period). The memory controller may accurately determine the applicable write leveling delays/parameters in any of such environments.

7. CONCLUSION

While various embodiments of the present invention have been described above, it should be understood that they have been presented by way of example only, and not limitation.

Thus, the breadth and scope of the present invention should not be limited by any of the above-described embodiments, but should be defined only in accordance with the following claims and their equivalents.

What is claimed is:

1. A memory system comprising:
   a plurality of memory units coupled in a sequential chained topology to a chained path; and
   a memory controller operable to perform a write leveling operation by sending a first clock signal on said chained path and further operable to write data to a first memory unit of said plurality of memory units by sending a second clock signal on said chained path, wherein said first clock signal has a lower frequency than said second clock signal.

2. The memory system of claim 1, wherein said memory controller performing said write leveling operation is operable to:
   send a command on said chained path operable to place said first memory unit in a write leveling mode, wherein said first memory unit is operable to sample said first clock signal when a strobe signal is received in said write leveling mode;
   assert said strobe signal with a first delay and operable to receive a first logic value from said first memory unit in response thereto, and further operable to assert said strobe signal with a second delay and operable to receive a second logic value from said first memory unit in response thereto, wherein a delay determined by performing said write leveling operation is defined by said first delay and said second delay, and wherein said memory controller is operable to write data to said first memory unit based on said delay.

3. The memory system of claim 2, wherein said memory controller is further operable to search for said delay by varying delays associated with said strobe signal.

4. The memory system of claim 1, wherein said memory controller is further operable to receive data from a processing block along with a write command, wherein said data is received after said write leveling operation is performed.

5. The memory system of claim 2, wherein said memory controller is further operable to:
   issue a write request on said chained path;
   provide data on a data bus coupled to said first memory unit; and
   assert said strobe signal based on said delay, wherein said issuing and said providing are performed in response to a write command.

6. The memory system of claim 1, wherein said memory controller comprises a clock generator operable to generate said first clock signal and said second clock signal from a common signal.

7. The memory system of claim 1, wherein a frequency of said second clock signal is a fraction of a frequency of said first clock signal.

8. The memory system of claim 1, wherein a frequency of said second clock signal is half of a frequency of said first clock signal.

9. The memory system of claim 2, wherein said strobe signal is sent on a DQS path, wherein said first and said second logic values are received on a same path, wherein said same path is a data (DQ) path operable to be used in said write data.

10. A method of operating a memory system in sequential chained topology on a chained path, said method comprising:
    performing a write leveling operation by sending a first clock signal on said chained path to determine a delay associated with write operations in a first memory unit of a plurality of memory units; and
    subsequent to said performing a write leveling operation, writing data to said first memory unit by sending a second clock signal on said chained path,
    wherein said writing is based on said delay,
    wherein said first clock signal has a lower frequency than said second clock signal.

11. The method of claim 10, wherein said performing said write leveling operation comprises:
    sending a command on said chained path operable to place said first memory unit in a write leveling mode, wherein said first memory unit is operable to sample said first clock signal when a strobe signal is received in said write leveling mode;
    asserting said strobe signal with a first delay and operable to receive a first logic value from said first memory unit in response thereto, and further operable to assert said strobe signal with a second delay and operable to receive a second logic value from said first memory unit in response thereto, wherein said delay is defined by said first delay and said second delay.

12. The method of claim 11, wherein said performing said write leveling comprises:
    performing a search by varying delays associated with said strobe signal.

13. The method of claim 10, further comprising:
    receiving said data from a processing block along with a write command, wherein said data is received after said writing level operation is performed.

14. The method of claim 10, wherein said writing comprises:
    issuing a write request on said chained path;
    providing said data on a data bus coupled to said first memory unit; and
    asserting a strobe signal determined by said delay,
    wherein said issuing and said providing are performed in response to a write command.

15. The method of claim 10, further comprising:
    deriving said first clock signal and said second clock signal from a common signal.

16. The method of claim 10, wherein a frequency of said second clock signal is a fraction of a frequency of said first clock signal.

17. A memory controller in a memory system comprising a plurality of memory units coupled in a sequential chained topology on a chained path, said memory controller comprising:
    means for performing a write leveling operation by sending a first clock signal on said chained path to determine a delay associated with write operations in a first memory unit of said plurality of memory units; and
    means for writing data to said first memory unit by sending a second clock signal on said chained path,
    wherein said writing is subsequent to said performing a write leveling operation, and wherein said writing is based on said delay,
    wherein said first clock signal has a lower frequency than said second clock signal.

18. The memory controller of claim 17, wherein said means for performing comprises:
    means for sending a command on said chained path operable to place said first memory unit in a write leveling mode, wherein said first memory unit is operable to sample said first clock signal when a strobe signal is received in said write leveling mode; and means for asserting said strobe signal with a first delay and operable to receive a first logic value from said first memory unit in response thereto, and further operable to assert said strobe signal with a second delay and operable to receive a second logic value from said first memory unit in response thereto, wherein said delay is defined by said first delay and said second delay.

19. The memory controller of claim 17, further comprising:

means for receiving said data from a processing block along with a write command, wherein said data is received after said writing level operation is performed.

20. The memory controller of claim 17, wherein said means for writing comprises:

means for issuing a write request on said chained path;

means for providing said data on a data bus coupled to said first memory unit; and means for asserting a strobe signal determined by said delay, wherein said issuing and said providing are performed in response to a write command.

* * * * *